United States Patent [19]

Vogel et al.

[11] Patent Number: 5,665,522
[45] Date of Patent: Sep. 9, 1997

[54] VISIBLE IMAGE DYES FOR POSITIVE-ACTING NO-PROCESS PRINTING PLATES

[75] Inventors: Dennis E. Vogel, Lake Elmo; Robert J. Balchunis, St. Paul; James P. Gardner, Stillwater; George V.D. Tiers, St. Paul; Kim M. Vogel, Lake Elmo, all of Minn.

[73] Assignee: Minnesota Mining and Manufacturing Company, St. Paul, Minn.

[21] Appl. No.: 433,887

[22] Filed: May 2, 1995

[51] Int. Cl.⁶ .............. G03F 7/039; G03F 7/105; G03F 7/26
[52] U.S. Cl. .............. 430/278.1; 430/292; 430/334; 430/302; 430/914; 430/270.1
[58] Field of Search .............. 430/270.1, 292, 430/334, 278, 302, 346, 914, 278.1

[56] References Cited

U.S. PATENT DOCUMENTS

| | | | |
|---|---|---|---|
| 4,139,390 | 2/1979 | Rauner et al. | 96/91 N |
| 4,399,210 | 8/1983 | Nagano et al. | 430/175 |
| 4,425,424 | 1/1984 | Aldand | 430/270 |
| 4,499,304 | 2/1985 | Gabrielsen et al. | 564/92 |
| 4,598,036 | 7/1986 | Iwasaki et al. | 430/270 |
| 4,617,250 | 10/1986 | Nakakita et al. | 430/175 |
| 5,030,548 | 7/1991 | Fujikura et al. | 430/281 |
| 5,102,771 | 4/1992 | Vogel et al. | 430/270 |
| 5,141,839 | 8/1992 | Mitchell et al. | 430/276 |
| 5,141,842 | 8/1992 | Mitchell et al. | 430/285 |
| 5,225,316 | 7/1993 | Vogel et al. | 430/270 |

FOREIGN PATENT DOCUMENTS

| | | |
|---|---|---|
| 1356086 | 6/1972 | United Kingdom . |
| 2029428 | 8/1979 | United Kingdom . |
| 2038801 | 10/1979 | United Kingdom . |

*Primary Examiner*—Cynthia Hamilton
*Attorney, Agent, or Firm*—Gregory A. Evearitt; Walter N. Kirn; Gary L. Griswold

[57] ABSTRACT

Positive-acting no-process printing plates are disclosed in which a stable visual or print-out image is obtained upon exposure of the plate to actinic radiation. The visual image is obtained by incorporation into the photosensitive layer, a dye which is irreversibly bleached upon exposure of the printing plate. For example, an acid which is generated upon exposure of a photopolymer to radiation may be used to bleach a dye of this invention. The visual or print-out images produced are useful in the production cycle and are stable to basic environments that may be encountered in the production setting.

29 Claims, No Drawings

VISIBLE IMAGE DYES FOR POSITIVE-ACTING NO-PROCESS PRINTING PLATES

FIELD OF THE INVENTION

The present invention relates to dyes that are useful as visible imaging dyes in positive-acting no-process printing plate applications.

BACKGROUND OF THE ART

In a typical work flow, a printing plate is exposed and developed before it is placed on press. It is desirable for the exposed plate to show a visible image (i.e., print-out image) to aid in alignment and registration. Also, the visible image can indicate to the operator whether or not a plate has been exposed. Typically the photosensitive coating of a printing plate contains a colorant (pigment or dye) to give the unexposed plate an overall color. Since prior to development printing plates are typically handled under yellow safe lights, high contrast images cannot be achieved with yellow dyes. If the colorant changes hue upon exposure, it reveals where the plate has been exposed, and after development, where the plate no longer has coating.

In negative-acting printing plate systems the visible image is typically rendered by use of a leuco dye, interacting with an appropriate oxidizing agent formed during exposure, to give a colored visible image in the exposed areas (e.g., see U.S. Pat. Nos. 5,141,842; 4,499,304; 5,141,839; 4,139,390; 4,425,424; 5,030,548; 4,598,036; Gr. Brit. Pat. Appl. No. 2,029,428; Eur. Pat. Publ. No. 434,968; and Jap. Pat. No. 2-058,573).

In conventional positive-acting printing plate systems it is generally preferred that, upon exposure, the initial color of the colorant changes to another color (i.e., other than colorless) to indicate that the plate has been exposed, but not yet developed. Thus, for positive-acting systems, commonly used dyes are acid indicator dyes (e.g., see Jap. Pat. No. 5-107,754). After development, the exposed areas are gray or metallic in appearance due to the color of the aluminum. The non-exposed areas maintain the color of the colorant throughout the process.

Colorants typically used in forming a positive visible image are pigments or dyes that change hue in the presence of a co-reactant that is formed or generated during exposure. Known co-reactants include acids, radicals, and photodecomposition products of o-naphthoquinonediazides (e.g., see Gr. Brit. Pat. Appl. No. 2,038,801; Jap. Pat. Nos. 4-153,655; 91-042,460; 92-002,179; and 5-150,455).

Stable print-out images have been reported in U.S. Pat. No. 4,399,210 and Jap. Pat. No. 92-002,179. Photosensitive compositions containing o-naphthoquinonediazides generate photodecomposition products (i.e. free-radicals) that are decolorizing agents for dyes such as Brilliant Green, Eosine, Ethyl Violet, Phenolphthalein, Quinaldine Red, Rose Bengal, Methyl Orange and others including pyrazolone derivatives. The decolorization of these dyes by strong acid is not suggested.

In German Pat. No. 2,231,247 and Gr. Brit. Pat. No. 1,356,086 o-quinone-diazide compounds are used in positive-acting printing plate applications with "leuco" dyes (i.e., color bases) that generate color with acid. In Eur. Pat. Publ. No. 123,153 o-quinone-diazide compounds are used in positive-acting printing plate applications with acid indicator dyes to generate positive visible images.

In Jap. Pat. No. 89-057,777 disulfones are used to generate free radical species to interact with and discolor arylamines, leuco dyes, azomethine dyes, anthraquinone dyes, etc.

In another approach, dyes are used with a stabilized diazo light-sensitive composition to give a visible image (e.g., see U.S. Pat. No. 4,617,250).

In an alternative approach to forming a positive visible image, the plate is first developed, and then a dye is transferred from a donor sheet to the printing plate by intimate contact with heat (e.g., see Jap. Pat. No. 5-053,309).

Positive-acting no-process printing plates (i.e., photosensitive articles which do not have to be liquid-developed before being used on press) have been described in U.S. Patent Nos. 5,102,771 and 5,225,316. These printing plates are prepared by coating on a substrate a photosensitive composition which comprises: (a) a photoinitiator which generates a strong acid upon exposure to radiation; and (b) a polymer having acid-labile groups pendant from the polymer backbone, said pendant groups being represented by the formula:

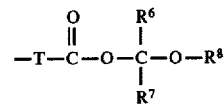

wherein:

$R^6$ and $R^7$ each represent H or an alkyl group with 1 to 18 carbon atoms with the proviso that at least one of $R^6$ and $R^7$ must be hydrogen; $R^8$ represents an alkyl group with 1 to 18 carbon atoms; or any two of $R^6$, $R^7$, and $R^8$ may together form a substituted or unsubstituted ring having from 3 to 36 carbon atoms; and T represents an optional divalent linking group bonded to the polymer backbone selected from the group consisting of O, NH, S, and an alkylene group containing from 1 to about 18 carbon atoms, where one or more carbon atoms may be replaced by oxygen, nitrogen, sulfur atoms, or chemically reasonable combinations thereof. These compositions are used on an imageable article which comprises a substrate coated with the above-described photosensitive composition. These articles are used in processes in which the imageable article is irradiated and then directly placed on press for use as a printing plate without liquid wash-off development. The incorporation of acid-base indicator dyes (e.g., bromophenyl blue and ethyl violet) to give a print-out image upon exposure is also disclosed.

While acid-base indicator dyes may be used to give a visual image in no-process positive-acting printing plates, it has been found that the image is not stable when the plate comes into contact with basic materials (e.g., fountain solution, etc.) encountered during ordinary handling. There is a need in the industry for no-process positive-acting printing plates capable of generating visual or print-out images which are stable to basic environments. It was against this background that the present invention dealing with dyes capable of providing stable visual or print-out images for no-process positive-acting printing plates was developed.

SUMMARY OF THE INVENTION

A positive-acting no-process printing plate is provided comprising a substrate coated with a photosensitive composition comprising: (a) a photoinitiator which generates a strong acid upon exposure to radiation; (b) a polymer having acid-labile groups pendant from the polymer backbone; and (c) a dye capable of being irreversibly bleached by said acid, providing a visible image upon exposure to radiation.

In another embodiment, this invention provides a process for forming a visible image on a positive-acting no-process printing plate by irradiating a substrate coated with a photosensitive composition comprising: (a) a photoinitiator which generates a strong acid upon exposure to radiation; (b) a polymer having acid-labile groups pendant from the polymer backbone; and (c) a dye capable of being irreversibly bleached by said acid, providing a visible image.

Preferred dyes of the present invention capable of being irreversibly bleached by acid upon exposure of the printing plate to radiation have a central nucleus selected from the group of formulas consisting of:

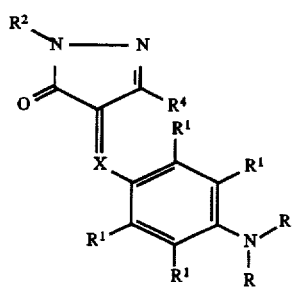

I wherein R is independently an alkyl, cycloalkyl, alkaryl, or alkanoyl group having from 1 to 16 carbon atoms, or each R together with the nitrogen atom to which they are attached represents the necessary atoms to form a five- or six-membered ring; $R^1$ is independently hydrogen, halogen, cyano, or an alkyl, cycloalkyl, or alkoxy group having from 1 to 8 carbon atoms; or R and $R^1$ together with the nitrogen and two carbon atoms by which they are connected represent the necessary atoms to form a five- or six-membered ring; $R^2$ is Ar or an alkyl, cycloalkyl, or alkaryl group having from 1 to 16 carbon atoms; Ar is a substituted or unsubstituted aryl group, preferably a substituted or unsubstituted phenyl or naphthyl group; E is independently an electron withdrawing group selected from the group consisting of CN, $SO_2R^3$, $C(O)R^3$, and $NO_2$; and $R^3$ is independently an alkyl, cycloalkyl, or alkaryl group having from 1 to 16 carbon atoms, or each $R^3$ taken together with the atoms to which they are attached represent the necessary atoms to form a five- or six-membered ring;

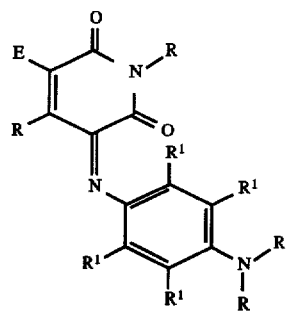

II wherein X is N or $CR^1$; $R^4$ is H, $CH_3$, $NHR^2$, $NHC(O)R^2$, or $NR_2$; and R, $R^1$ and $R^2$ are as previously defined;

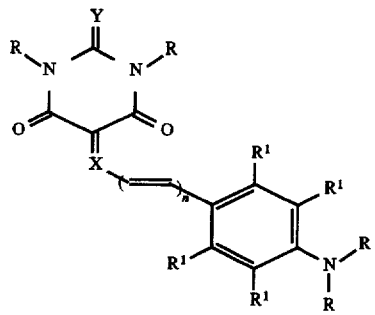

III wherein Y is O or S; n is 0 or 1; and R, $R^1$, and X are as previously defined with the proviso that when Y is S, then X is N;

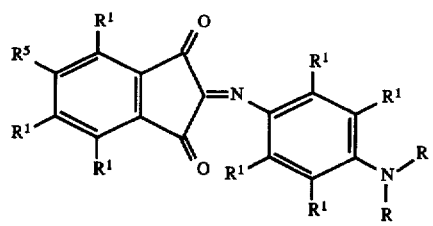

IV wherein R and $R^1$ are as previously defined; $R^5$ is $R^1$, or $R^5$ and $R^1$ taken together with the two carbon atoms by which they are connected represent the necessary atoms to form a five- or six-membered carbocyclic or heterocyclic, non-aromatic or aromatic ring;

V wherein R, $R^1$, and E are as previously defined; and

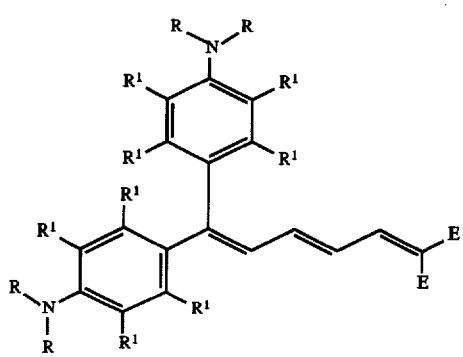

VI wherein R, $R^1$, and E are as previously defined.

Preferred polymers of the present invention having acid-labile groups are represented by the formula:

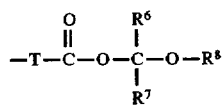

wherein:

R⁶ and R⁷ each represent H or an alkyl group with 1 to 18 carbon atoms with the proviso that at least one of R⁶ and R⁷ must be hydrogen; R⁸ represents an alkyl group with 1 to 18 carbon atoms; or any two of R⁶, R⁷, and R⁸ may together form a substituted or unsubstituted ring having from 3 to 36 carbon atoms; and T represents an optional divalent linking group bonded to the polymer backbone selected from the group consisting of O, NH, S, and an alkylene group containing from 1 to about 18 carbon atoms, where one or more carbon atoms may be replaced by oxygen, nitrogen, sulfur atoms, or chemically reasonable combinations thereof.

The term "irreversibly bleached" means that in a printing plate construction, visually no, or only slight, recoloration (i.e., less than 50% of the initial optical density) occurs in the exposed areas, under environmental conditions which would typically recolor the exposed region in printing plate constructions using known acid-base indicator dyes (reversible dyes).

The term "no-process" refers to a photosensitive element which can be irradiated and placed on press to be inked and run on press without any prior liquid or thermal development step to remove irradiated or non-irradiated areas from the photosensitive layer.

The term "group" refers not only to pure hydrocarbon chains or structures such as methyl, ethyl, cyclohexyl, and the like, but also to chains or structures bearing conventional substituents in the art such as hydroxyl, alkoxy, phenyl, halo (F, Cl, Br, I), perhalo, cyano, nitro, amino, sulfonyl, etc.

When a general structure is referred to as "a compound having the central nucleus of" a given formula, any substitution which does not alter the bond structure of the formula or the shown atoms within that structure, is included within that structure. For example, where there is a polymethine chain shown between two defined heterocyclic nuclei, the chain may be rigidized by a cyclic group, and substituent groups may be placed on the chain, but the conjugation of the chain may not be altered and the atoms shown in the heterocyclic nuclei may not be replaced. The description of a formula as "a general formula" does not specifically allow for such broader substitution of the structure.

The dyes of the present invention are capable of imparting a positive visible image to the printing plate after imagewise exposure (e.g., exposure through a mask). The image is suitable for locating the exposed regions of the plate, inspecting the plate, and determining the proper inking on press when used with plate scanners. The dyes change their absorption characteristics upon interaction with the strong protic acids that are generated during exposure. It is desirable for the dye to bleach (i.e., change to either colorless or yellow, which would appear to be colorless under yellow lights) so that the plate has the appearance of being developed immediately upon exposure. The visible absorption of the dye is dramatically reduced. In the most preferred case, the dye bleaches to colorless in an irreversible fashion in the exposed regions. Dyes that bleach irreversibly do not recolor after standing in air or upon treatment with basic solutions. Irreversibility is important, since after exposure the coating may became more basic from contact with water and fountain solution, or from handling. The resulting basicity may cause an exposed plate to recolor if the dye changes color reversibly, as is the case with acid-base indicator dyes. It is also desirable to have a permanent image after exposure. Thus, the most preferred dyes change color irreversibly at low pH.

Other aspects, advantages, and benefits of the present invention are apparent from the detailed description, examples, and claims.

DETAILED DESCRIPTION OF THE INVENTION

The positive-acting no-process printing plates of the present invention comprise a substrate coated with a photosensitive composition comprising a photoinitiator which generates a strong acid upon exposure to radiation, a polymer having acid-labile groups pendant from the polymer backbone, and a dye capable of being irreversibly bleached by acid to form a visible image.

Polymers having acid-labile groups pendant from the polymer backbone are disclosed in U.S. Pat. Nos. 5,102,771 and 5,225,316, incorporated herein by reference. Preferred polymers of the present invention are represented by the formula:

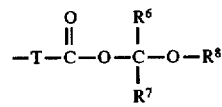

wherein:

R⁶ and R⁷ each represent H or an alkyl group with 1 to 18 carbon atoms with the proviso that at least one of R⁶ and R⁷ must be hydrogen; R⁸ represents an alkyl group with 1 to 18 carbon atoms; or any two of R⁶, R⁷, and R⁸ may together form a substituted or unsubstituted ring having from 3 to 36 carbon atoms; and T represents an optional divalent linking group bonded to the polymer backbone selected from the group consisting of O, NH, S, and an alkylene group containing from 1 to about 18 carbon atoms, where one or more carbon atoms may be replaced by oxygen, nitrogen, sulfur atoms, or chemically reasonable combinations thereof.

The photoinitiator used herein is one which generates a strong acid upon exposure to radiation. Many such substances are known in the photoimaging art including, but not limited to, various onium compounds (e.g., sulfonium, iodonium, diazonium, etc.; particularly aryl derivatives thereof), and various organic compounds with photolabile halogen atoms (α-halo-p-nitrotoluenes, halomethyl-s-triazines, carbon tetrabromide, etc.) While the choice of photoinitiator is not critical, it is desirable that the photoinitiator have limited solubility in water in order to provide maximal inkability.

In a preferred embodiment, the photoinitiator is a substituted or unsubstituted diaryliodonium salt. Non-limiting examples of suitable iodonium salts are salts of diphenyliodonium, ditolyliodonium, dinaphthyliodonium, di(4-chlorophenyl)iodonium, tolyl(dodecylphenyl) iodonium, naphthylpheyliodonium, 4-(trifluoromethylphenyl)phenyliodonium, 4-ethylphenylphenyliodonium, di(4-acetylphenyl) iodonium, tolylphenyliodonium, di(4-phenylphenyl) iodonium, di(carbomethoxyphenyl)iodonium, and the like. Diphenyliodonium salts and substituted derivatives thereof (e.g., ditolyliodonium, 4-t-butylphenylphenyliodonium, etc.) are preferred. The iodonium salts may be made with any anion capable of forming a stable salt with diphenyliodonium cation at room temperature, i.e., the anion must have a pKa less than about 16, and an oxidation potential of greater than about 0.7 V. Preferred anions are complex halogenated metal anions such as hexafluorophosphate, hexafluoroantimonate, hexafluoroarsenate; borates such as tetrafluoroborate and tetraphenylborate; and sulfonates such as p-toluenesulfonate. Particularly preferred anions are hexafluorophosphate, hexafluoroantimonate, and p-toluenesulfonate.

The photolyzable organic halogen compounds which are useful in the present invention are those that upon exposure to radiation dissociate at one or more carbon-halogen bonds to form free radicals. The carbon-halogen bond dissociation energy should be between about 40 and 70 kcal/mole as taught in U.S. Pat. No. 3,515,552. Preferred photolyzable organic halogen compounds have from 1 to 40 carbon atoms, are non-gaseous at room temperature, and have a polarographic half-wave reduction potential greater than about −0.9 V as described in U.S. Pat. Nos. 3,640,718 and 3,617,288.

Examples of photolyzable organic halogen compounds are hexabromoethane, α,α,α',α'-tetrabromoxylene, carbon tetrabromide, m-nitro(tribromoacetyl)benzene, α,α,α-trichloroacetanilide, trichloromethylsulfonylbenzene, α,α,α-tribromoquinaldine, bis(pentachlorocyclopentadiene), tribromomethylquinoxaline, α,α-dibromo-p-nitrotoluene, α,α,α,α',α',α'-hexachloro-p-xylene, dibromotetrachloroethane, pentabromoethane, dibromodibenzoylmethane, carbon tetraiodide, halomethyl-s-triazines such as 2,4-bis(trichloromethyl)-6-methyl-s-triazine, 2,4,6-tris(trichloromethyl)-s-triazine, and 2,4-bis(trichloromethyl)-6-(p-methoxystyryl)-s-triazine, etc.

The iodonium salts or photolyzable organic halogen compounds employed in the present invention may be either exposed to ultraviolet radiation or, when appropriately sensitized, to radiation in the visible or infrared spectrum. Wavelengths between 250 nm and 1200 nm inclusive may be used. Compounds useful as sensitizing dyes for this invention include, but are not limited to, substituted or unsubstituted anthracenes, aryl nitrones, xanthenes, anthraquinones, substituted diaryl- and triarylmethanes, methines, merocyanines, and polymethines, thiazoles, substituted and unsubstituted polycyclic aromatic hydrocarbons, and pyrylium dyes.

The photosensitive compositions of the present invention are generally coated onto a substrate prior to use in an imaging application. Coating may be achieved by many methods well known in the imaging art (e.g., solvent casting, knife coating, extrusion, etc.).

The coating weight of the photosensitive layer applied to the substrate will depend on the specific application and the desired processing requirements (e.g., light source, exposure time, etc.). However, typical dry coat weights will range from about 0.4 g/m² (40 mg/ft²) to about 5.4 g/m² (500 mg/ft²), preferably from about 0.6 g/m² (60 mg/ft²) to about 1.1 g/m² (100 mg/ft²).

In some instances it is desirable to add a non-photosensitive hydrophilic topcoat over the photosensitive layer as described in copending U.S. patent application Ser. No. 08/311,510, filed Sep. 23, 1994. The topcoat remains over the photosensitive layer after exposure until it is removed on press. The topcoat may improve the press performance (e.g., shorter roll-up time) of the resulting no-process positive-acting printing plate.

Suitable substrates on which the photosensitive composition may be coated include, but are not limited to, metals or metal alloys, for example steel and aluminum plates, sheets or foils including aluminum treated with hydrophilic agents, such as silicates or polyacrylic acid and its derivatives; films or plates composed of various film-forming synthetic or natural based (e.g., cellulose acetate, gelatin, etc.) polymers including addition polymers (e.g., poly(vinylidene chloride), poly(vinyl chloride), poly(vinyl acetate), polystyrene, polyisobutylene polymers and copolymers), and linear condensation polymers (e.g., poly(ethylene terephthalate), poly(hexamethylene adipate), poly(hexamethylene adipamide/adipate)); paper or paper laminates. Aluminum and aluminum alloys are preferred substrates. Aluminum or aluminum alloys which have been electrochemically grained and anodized are particularly preferred.

The photosensitive compositions of the present invention may contain various materials in combination with the essential ingredients of the present invention. For example, plasticizers, coating aids, antioxidants, surfactants, antistatic agents, waxes, ultraviolet radiation absorbers, and brighteners may be used without adversely affecting the practice of the invention. The various materials preferably should not contain significant levels of functional groups (e.g., free amines, alkoxides, sulfides, amides, urethanes, imides, etc.) which are more basic than the alkoxyalkyl ester employed in the present invention as defined above.

Preferred dyes of the present invention capable of being irreversibly bleached by acid upon exposure of the printing plate to radiation have a central nucleus selected from the group of formulas consisting of:

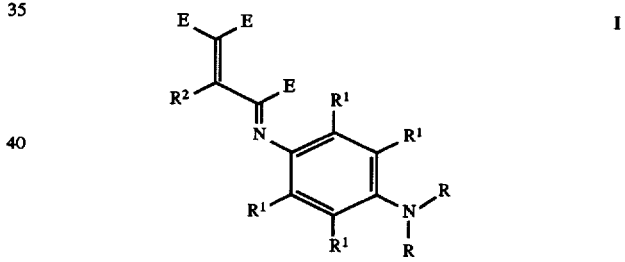

I wherein R is independently an alkyl, cycloalkyl, alkaryl, or alkanoyl group having from 1 to 16 carbon atoms, or each R together with the nitrogen atom to which they are attached represents the necessary atoms to form a five- or six-membered ring; R¹ is independently hydrogen, halogen, cyano, or an alkyl, cycloalkyl, or alkoxy group having from 1 to 8 carbon atoms; or R and R¹ together with the nitrogen and two carbon atoms by which they are connected represent the necessary atoms to form a five- or six-membered ring; R² is Ar or an alkyl, cycloalkyl, or alkaryl group having from 1 to 16 carbon atoms; Ar is a substituted or unsubstituted aryl group, preferably a substituted or unsubstituted phenyl or naphthyl group; E is independently an electron withdrawing group selected from the group consisting of CN, SO₂R³, C(O)R³, and NO₂; and R³ is independently an alkyl, cycloalkyl, or alkaryl group having from 1 to 16 carbon atoms, or each R³ taken together with the atoms to which they are attached represent the necessary atoms to form a five- or six-membered ring;

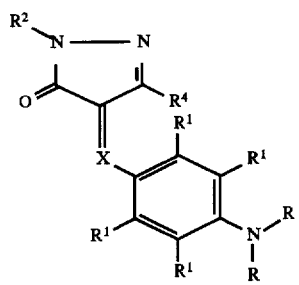

wherein X is N or $CR^1$; $R^4$ is H, $CH_3$, $NHR^2$, $NHC(O)R^2$, or $NR_2$; and R, $R^1$ and $R^2$ are as previously defined;

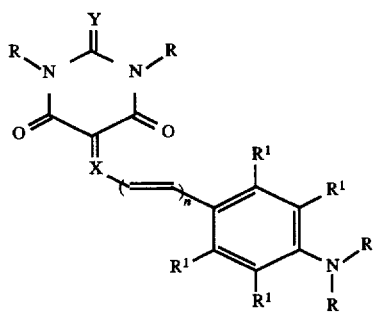

wherein Y is O or S; n is 0 or 1; and R, $R^1$, and X are as previously defined with the proviso that when Y is S, then X is N;

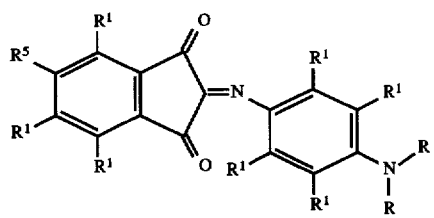

wherein R and $R^1$ are as previously defined; $R^5$ is $R^1$, or $R^5$ and $R^1$ taken together with the two carbon atoms by which they are connected represent the necessary atoms to form a five- or six-membered carbocyclic or heterocyclic, non-aromatic or aromatic ring;

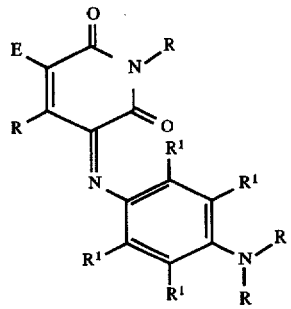

wherein R, $R^1$, and E are as previously defined; and

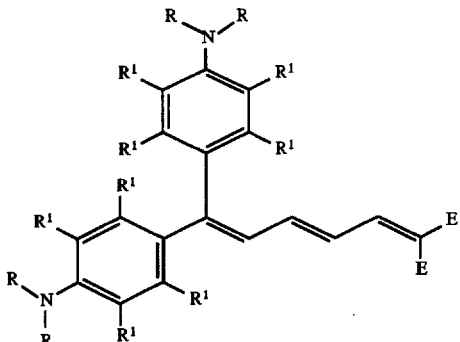

wherein R, $R^1$, and E are as previously defined.

Dyes may be incorporated into the photosensitive coating formulation at any level desired, typically from about 0.1% to about 10% by weight based on the dry photosensitive coating weight, preferably from about 0.5% to about 5%, more preferably from about 1% to about 2.5%.

The following non-limiting examples further illustrate the present invention.

EXAMPLES

The materials employed below were obtained from Aldrich Chemical Co. (Milwaukee, Wis.) unless otherwise specified. Materials were analyzed and purity established by one or more of the following techniques: $^1$H NMR, $^{13}$C NMR, infrared spectroscopy, and melting point.

The following dyes were prepared to evaluate their utility as irreversibly bleachable dyes in no-process positive-acting printing plate applications:

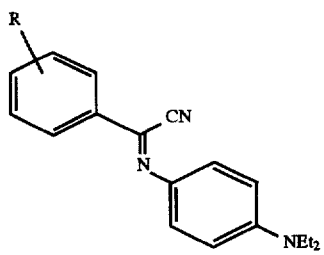

a    R = H
b    R = ortho-$NO_2$
c    R = para-$NO_2$

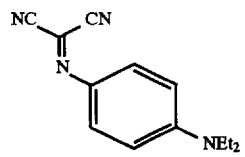

3
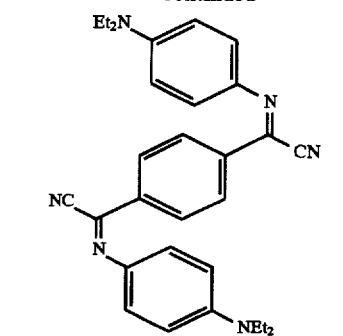
4
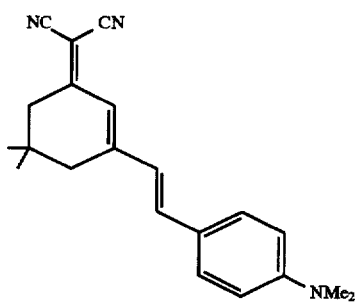
5
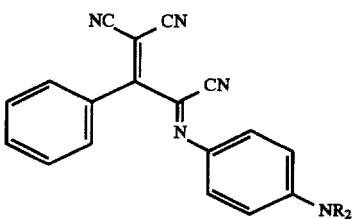
a   R = Me
b   R = Et
c   R = n-Bu
6
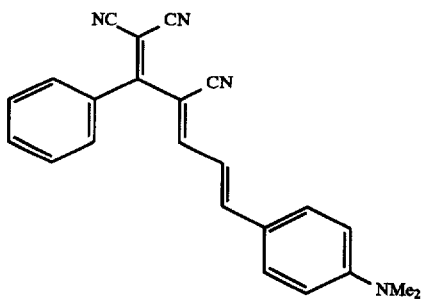
7
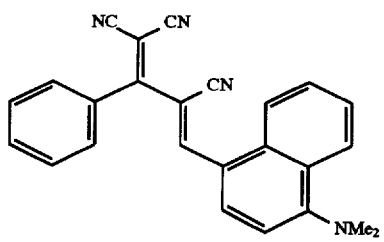
8
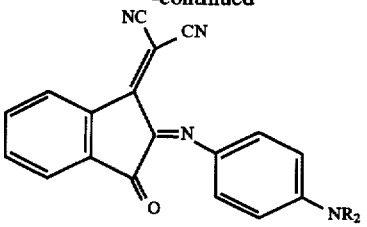
a   R = Me
b   R = Et
9
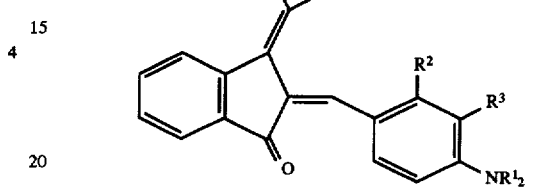
a   R¹ = Me   R², R³ = H
b   R¹ = Et   R², R³ = H
c   R¹ = Me   R², R³ = benzo
10
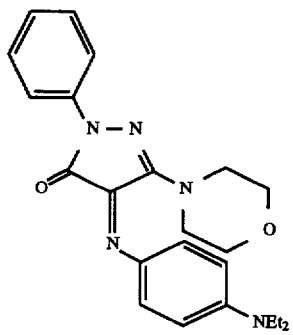
11
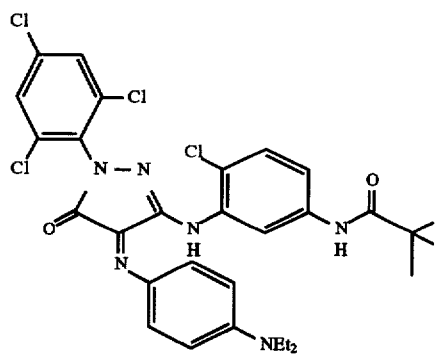
12
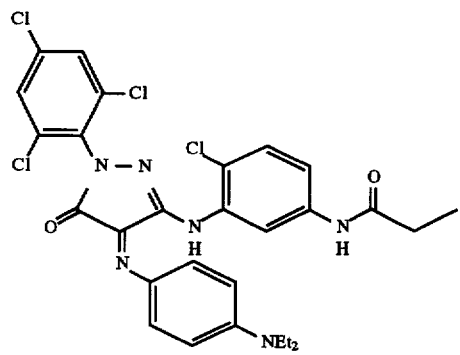

13
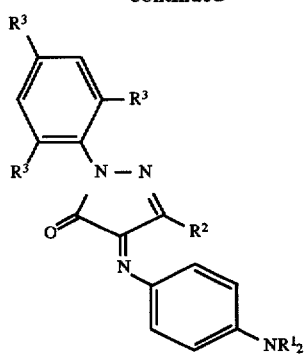
| | | | |
|---|---|---|---|
| a | R¹ = Me | R² = Me | R³ = H |
| b | R¹ = Et | R² = Me | R³ = H |
| c | R¹ = Et | R² = t-Bu | R³ = H |
| d | R¹ = Et | R² = Ph | R³ = H |
| e | R¹ = Et | R² = CF₃ | R³ = H |
| f | R¹ = Et | R² = t-Bu | R³ = Cl |
| g | R¹ = Et | R² = Ph | R³ = Cl |
14
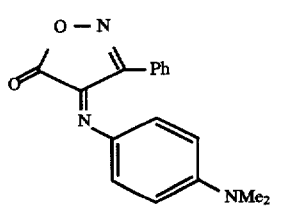
| | | |
|---|---|---|
| a | R¹ = Me | R² = H |
| b | R¹ = Et | R² = H |
| c | R¹ = Me | R² = CN |
| d | R¹ = Et | R² = CN |
15
16
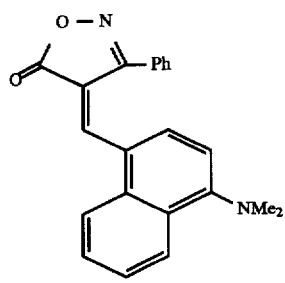
17
18
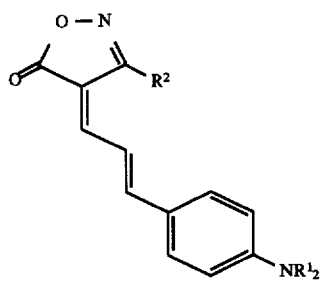
19
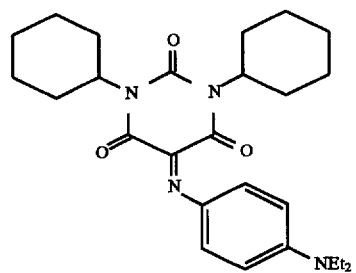
| | | |
|---|---|---|
| a | R¹ = Me | R² = Ph |
| b | R¹ = Et | R² = Ph |
| c | R¹ = Me | R² = t-Bu |
| d | R¹ = Et | R² = t-Bu |
| e | R¹ = Et | R² = Me |
20
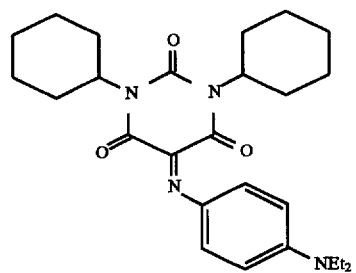
21
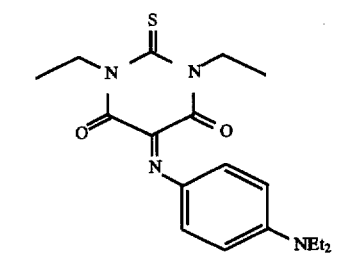

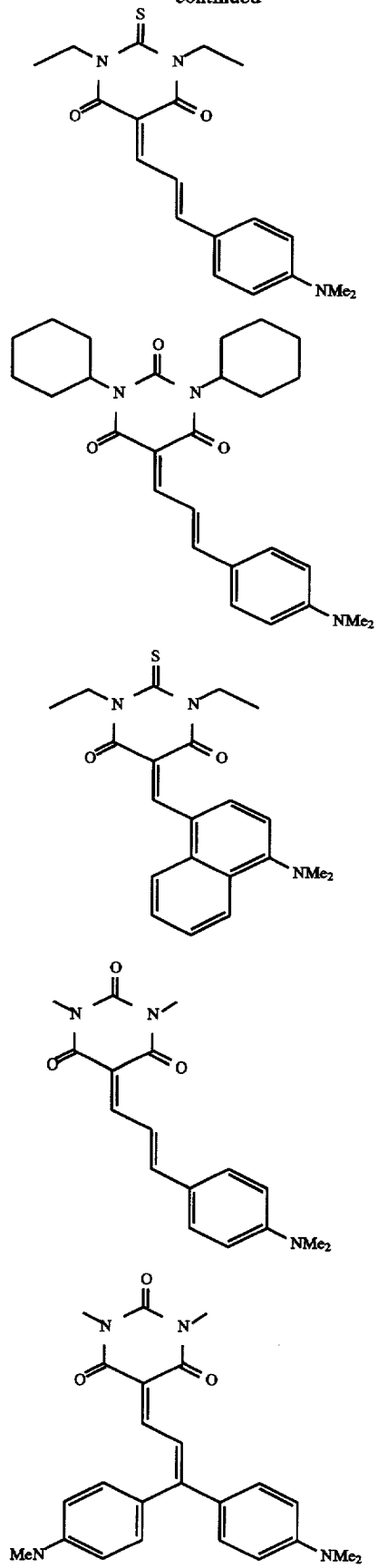
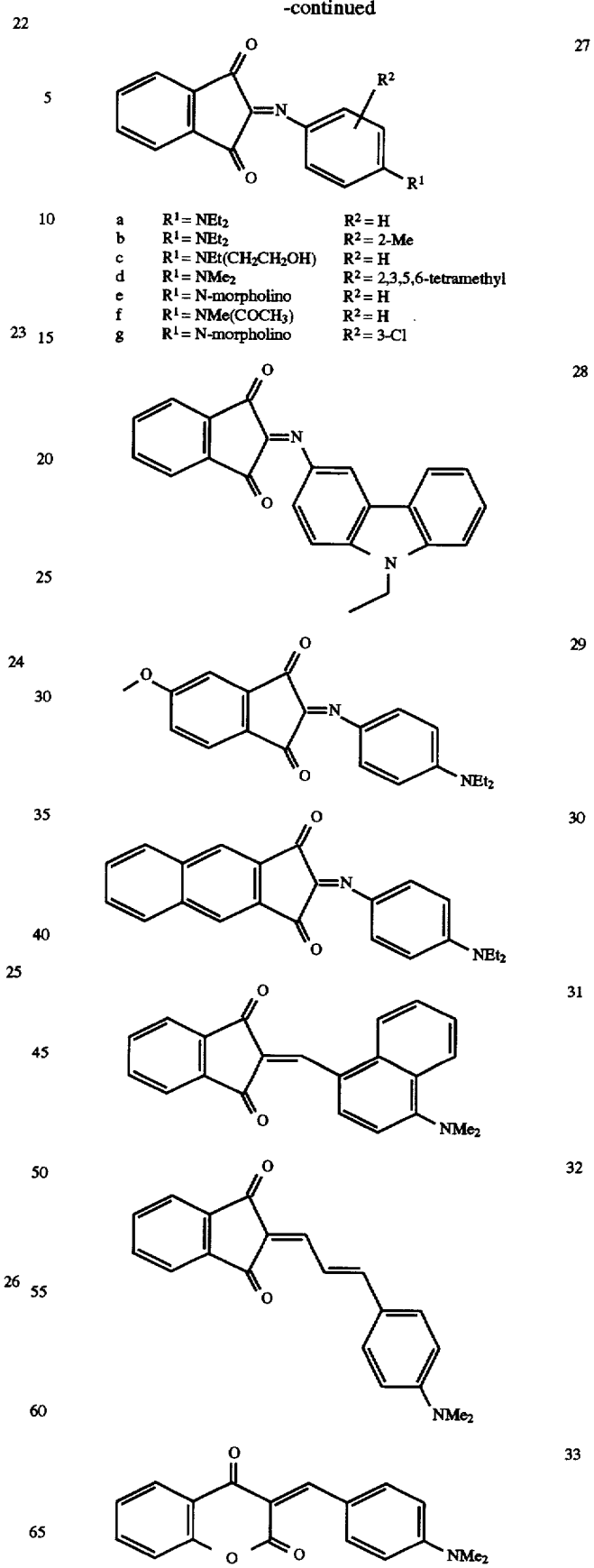
| | | |
|---|---|---|
| a | R¹ = NEt₂ | R² = H |
| b | R¹ = NEt₂ | R² = 2-Me |
| c | R¹ = NEt(CH₂CH₂OH) | R² = H |
| d | R¹ = NMe₂ | R² = 2,3,5,6-tetramethyl |
| e | R¹ = N-morpholino | R² = H |
| f | R¹ = NMe(COCH₃) | R² = H |
| g | R¹ = N-morpholino | R² = 3-Cl |

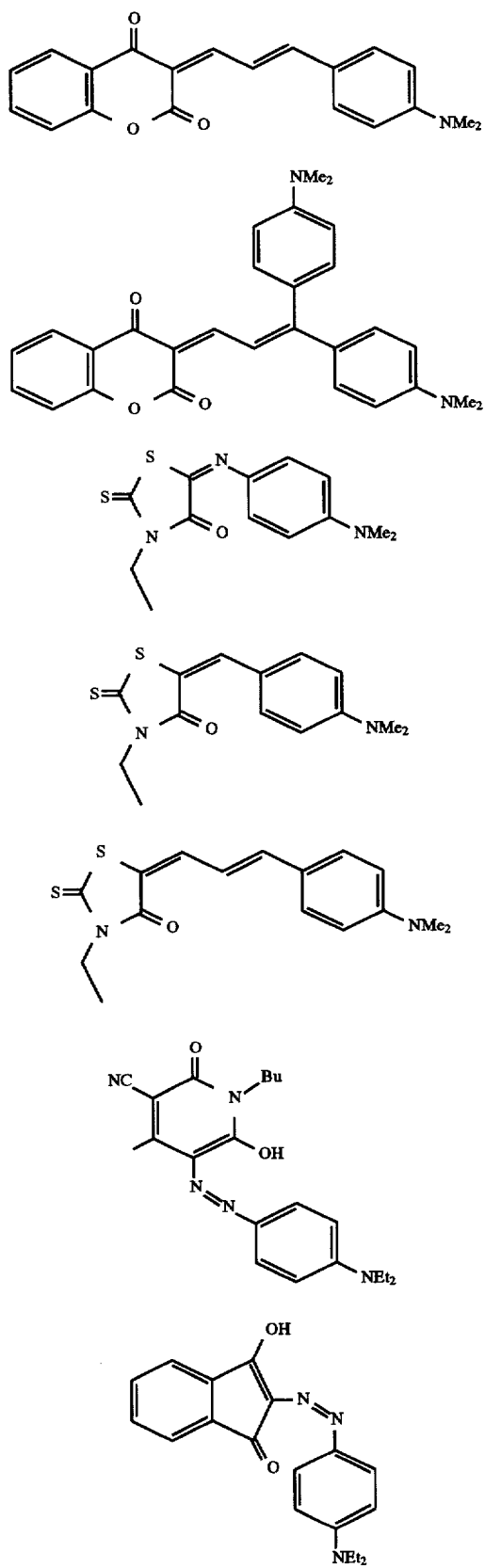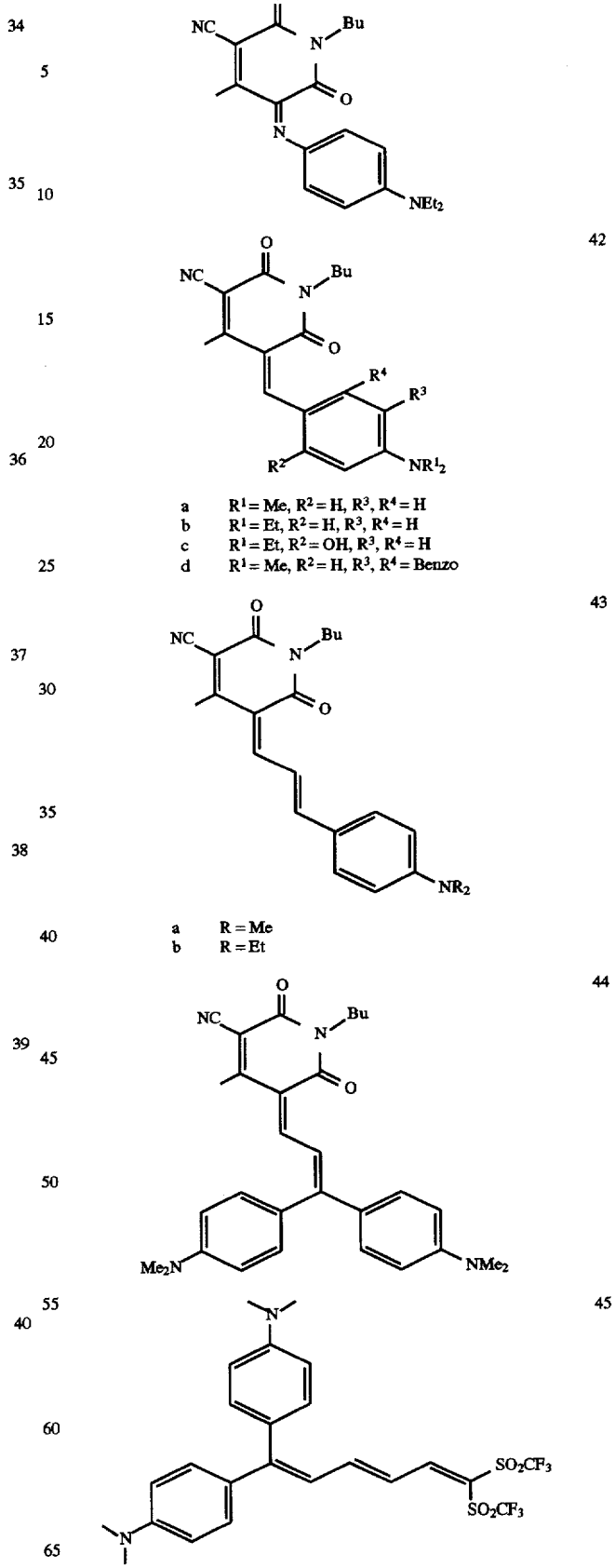

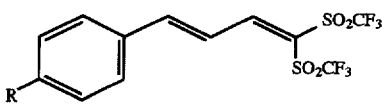

a   R = NMe₂
b   R = N(n-Bu)₂
c   R = N-morpholino

Preparation of Dyes

General Preparation of Azomethine Dyes 1, 2, 3.
Preparation of 1.

To 47.1 grams (264 mmol, 1 eq) of N,N-diethyl-4-nitrosoaniline dissolved in 1500 mL ethanol at room temperature, 31.0 grams (264 mmol, 1.0 eq) of benzyl cyanide was added followed by 35 ml of a 10% aqueous sodium hydroxide solution. The green color dissipated and the solution became dark yellow. After 10 minutes 900 grams of ice was added and the mixture was stirred until the ice had melted (about one hour). The product precipitated upon addition of the ice and was collected by filtration and air dried to afford a bright orange solid. The sample was recrystallized from 1 L of ethanol to give the desired product.

Preparation of N N-Dibutyl-4-nitrosoaniline

N,N-Dibutyl-4-nitrosoaniline was prepared by following the procedure of Vogel's Textbook of Practical Organic Chemistry fourth edition, Logman (London) 1978 p723.

Preparation of 5c

To 300 grams (7.50 mol, 2.5 eq, 180 grams of active NaH) 60 wt % sodium hydride in oil was added 492 grams (630 mL, 12.0 mol, 4 eq) of acetonitrile followed by 680 mL of toluene and 408 grams (370 mL, 3.00 mol, 1 eq) of methyl benzoate. The reaction mixture was heated and after 1.5 hours the reaction temperature reached 75° C. and was maintained there for 2.5 hours and was cooled. The mixture was stirred overnight at room temperature and 600 mL of toluene was added followed by the careful addition of 800 mL of water with cooling. Once the reaction mixture consisted of two phases, the toluene layer was separated and the aqueous layer was washed twice with 600 mL of toluene. The aqueous layer was acidified with cooling with approximately 850 mL of 12M HCl to a pH of 1. An additional 500 mL of water was added to this mixture to help dissolve inorganic salts that tend to precipitate at this point. A solid precipitated and was collected and washed with water followed by stirring with 1200 mL of ether. The solid was collected and again stirred with 500 mL of ether. This gave approximately 250 grams of solid. The ether filtrates were concentrated to give more product. The solid isolated from the ether triturations was dissolved in 1000 mL of acetone and filtered to remove a dark brown insoluble material. The acetone solution was concentrated in vacuo. The concentrated acetone solution gave 196 grams of pure product. The ether triturates were concentrated to give an additional 55 grams for a total of 251 grams (58% yield) of benzoylacetonitrile, mp 86°-87° C.

A mixture of 250 grams (1722 mmol, 1 eq) of benzoylacetonitrile, 284 grams (270 mL, 4306 mmol, 2.5 eq) of malononitrile and 138 grams (1784 mmol, 1.04 eq) of ammonium acetate in 2500 mL of ethanol was heated to reflux for 1.5 hours and then cooled to room temperature. To this mixture was added 190 mL of 12M hydrochloric acid dropwise with cooling (ice/water bath). The mixture was placed in a separate flask and a solid formed and filled the flask. To this mixture was added 3300 mL of water with stirring. The solid was collected and washed with 2 liters of water and triturated with 1200 mL of ethanol to give 203.3 grams (61% yield) of pure 2-phenyl-1,1,3-tricyanopropylene, mp 105°-107° C.

A solution of 65.3 grams (338 mmol, 1 eq) of 2-phenyl-1,1,3-tricyanopropylene in 1100 mL of methanol was prepared with slight heating to approximately 25° C. To this solution was added a solution of 79.2 grams (338 mmol, 1 eq) of N,N-dibutyl-4-nitrosoaniline in 260 mL of methanol. A solid precipitated after a few minutes. The reaction mixture was maintained at 26° C. with slight cooling throughout the addition which took 1 hour. The mixture was stirred at room temperature for 1 hour and then stirred at 7° C. for 2 hours. The solid was isolated by filtration, washed with 500 mL of methanol, and air dried to give 88.5 grams (64% yield) of 3-[[4-(dibutylamino)phenyl]imino]-2-phenyl-1-propene-1,1,3-tricarbonitrile, mp 126°-128° C.

Preparation of 5a and 5b

Dyes 5a and 5b were prepared as described for 5c except N,N-dimethyl-4-nitrosoaniline and N,N-diethyl-4-nitrosoaniline were used instead of N,N-dibutyl-4-nitrosoaniline.

3-(N-Morpholino)-1-phenyl-2-pyrazolin-5-one.

To 88.5 grams (1.02 moles, 4.45 eq) of morpholine in a one liter flask was added slowly 300 mL of acetic acid. The reaction was exothermic and a solid formed which mostly dissolved once all the acetic acid was added. To this mixture was added 40.0 grams (228.3 mmol, 1.0 eq) of 3-amino-1-phenyl-2-pyrazolin-5-one followed by heating at reflux overnight. The mixture was cooled to room temperature, the acetic acid was removed in vacuo and the residue was extracted with ethyl acetate. The organic phase was washed 2 times with brine, dried over magnesium sulfate and the solvent was removed in vacuo to give a brown solid that was dried in vacuo. The product was recrystallized from ethyl acetate with a small amount of hexane to give 22 grams of the desired product.

4-[(4-Diethlaminophenyl)imino]-3-(N-Morpholino)-1-Phenyl-2-pyrazolin-5-one (10).

To a solution of 0.50 grams (2.81 mmol, 1 eq) of N,N-diethylaminonitrosoaniline was dissolved in 10 mL EtOH at room temperature was added 0.688 grams (2.81 mmol, 1 eq) of 3-(N-morpholino)-1-phenyl-2-pyrazolin-5-one followed by 1.12 g (2.81 mmol, 1 eq) 10% aqueous sodium hydroxide solution. An additional 0.44 g (1.79 mmol, 0.64 eq) of 3-(N-morpholino)-1-phenyl-2-pyrazolin-5-one was added and the mixture was stirred 10 min at 50° C. and then at reflux for one hour. The mixture was cooled to room temperature and added to 12 grams of ice and stirred for one hour until the ice melted. The gummy solid was collected and dissolved in EtOAc, extracted with brine, dried over magnesium sulfate, filtered and the solvent was removed in vacuo.

Preparation of 3-t-Butyl-1-phenyl-2-pyrazolin-5-one.

A modification of the procedure from *J. Het. Chem.* 1987, 24, 149 (methyl derivative) was used.

A solution of 20 grams (126 mmol, 20 mL) of methyl 4,4-dimethyl-3-oxopentanone and 13.7 grams (126 mmol, 12 mL) of phenylhydrazine in 60 mL of acetic acid was stirred at room temperature for 2 hours and then quenched with 150 mL of water. A white-yellow solid precipitated and was collected to give 23.9 grams (87% yield) of the desired product.

Preparation of the following pyrazolinones was accomplished in a manner similar to that described for 3-t-butyl-1-phenyl-2-pyrazolin-5-one: 1,3-diphenyl-2-pyrazolin-5-one, 3-t-butyl-1-(2,4,6-trichlorophenyl)-2-pyrazolin-5-one, 3-phenyl-1-(2,4,6-trichlorophenyl)-2-pyrazolin-5-one.

Preparation of Pyrazolinone dyes 13.

Pyrazolinone dyes were prepared by either oxidative coupling between the pyrazolinone and the corresponding N,N-dialkyl p-phenylenediamine, or by the condensation of the pyrazolinone with the corresponding N,N-dialkyl-4-nitrosoaniline.

Preparation of Pyrazolinone dyes 13b. Method A Oxidative Coupling.

To a solution of 3.0 grams (17.3 mmol, 1 eq) of 3-methyl-1-phenyl-2-pyrazolin-5-one in 80 mL of chloroform was added a solution of 2.4 grams (22.4 mmol, 1.3 eq) of sodium carbonate in 50 mL of water. This mixture was added to a 1 L flask containing 5.12 grams (31.2 mmol, 1.8 eq) of N,N-diethylphenylenediamine. This mixture was stirred vigorously while a solution of 25.5 grams (77.5 mmol, 4.5 eq) of potassium ferricyanide and 9.35 grams (88.3 mmol, 5.12 eq) of sodium carbonate in 250 mL of water was added dropwise. The addition took approximately 10 minutes without a noticeable temperature increase and then was allowed to stir at room temperature for 30 minutes. The mixture was extracted two times with water and separated. The organic layer was dried and concentrated in vacuo to give a magenta oil. This material was chromatographed on silica gel to give 1.2 grams 21% yield of the desired dye.

Dyes also prepared by oxidative coupling were 11, 12, 13a.

Preparation of Pyrazolinone dyes 13b. Method B Nitroso Condensation I.

In a 3 L round bottom 3-necked flask was placed 100.0 grams (574.0 mmol, 1 eq) of 3-methyl-1-phenyl-2-pyrazolin-5-one, 5.795 grams (51.66 mmol, 0.09 eq) of DABCO and 1350 mL of ethanol. The mixture was heated to reflux to dissolve the last traces of solid. To this mixture was added 102.3 grams (574.0 mmol, 1 eq) of N,N-diethyl-4-nitrosoaniline. The mixture was heated to reflux for 30 minutes, cooled to room temperature and then stirred overnight. The product was collected by filtration and air dried to give 90 grams (47% yield) of the desired product. mp 122°–124° C.

Preparation of Pyrazolinone dyes 13c. Method C Nitroso Condensation II.

A mixture of 1.50 grams (6.93 mmol, 1 eq) of 3-t-butyl-1-phenyl-2-pyrazolin-5-one and 1.24 grams (6.93 mmol, 1.0 eq) of N,N-diethyl-4-nitrosoaniline in 10 mL of ethanol was stirred at room temperature. The mixture was heated to reflux for 2 hours and cooled. A solid precipitated and was collected and washed with ethanol. This gave 1.67 grams (64% yield) of the desired product. mp 111°–113° C.

Dyes prepared by this method are: 8a,b, 13d–g, 16, 17.

Preparation of 3-t-Butylisoxazol-5-one.

This material was prepared by a modification of the procedure in *Synthetic Communications*, 1993, 23, 2251.

A mixture of 8.8 grams (126 mmol, 1 eq) of hydroxylamine hydrochloride and 10 grams (126 mmol, 1 eq) in 40 mL of ethanol was heated to reflux and 20 grams (126 mmol, 1 eq) of methyl 4,4-dimethyl-3-oxopentanoate was added. The reaction mixture was heated for 2 hours and then allowed to cool to room temperature overnight. The mixture formed a precipitate. To this mixture was added 50 mL of water with stirring and more precipitate formed. The solid was collected by filtration and dried. This gave 13.1 grams (48% yield) of the desired product. mp 110°–15° C.

Preparation of 19a

A mixture of 3-t-butylisoxazol-5-one (705 mg, 0.005 mol) and cinnamaldehyde (875 mg, 1 eq) in 50 ml ethanol is refluxed briefly. On cooling to room temperature the product crystallizes out as prisms, is collected and air dried to afford the dye in 78% yield.

The following dyes were prepared by similar methods with the corresponding active methylene compounds and aldehydes: 4, 6, 7, 9a–c, 14a,b, 15, 18, 19b–d, 22, 23, 24, 25, 26, 31, 32, 33, 34, 35, 37, 38, 42, 43, 44, 46.

Preparation of 5-Bromo-N,N-dicyclohexylbarbituric Acid.

To 15.0 grams (51.3 mmol, 1 eq) of N,N-dicyclohexylbarbituric acid in 300 mL glacial acetic acid was added 8.20 grams (4.91 mL, 51.3 mmol, 1 eq) of bromine. The mixture was stirred at room temperature for two days. The resulting white solid was collected by filtration, washed with petroleum ether and dried in vacuo to give the desired material.

Preparation of 20

To 100 grams (2.69 mmol, 1 eq) of 5-bromo-N,N-dicyclohexylbarbituric acid and 0.545 grams (5.39 mmol, 2 eq) of triethylamine in 30 mL THF was added 0.442 grams (2.69 mmol, 1 eq) of N,N-diethylphenylenediamine and the mixture was stirred overnight at room temperature. The mixture was filtered to remove a white solid and the filtrate was concentrated in vacuo. The residue was diluted with ethyl acetate, extracted with water, washed with brine, dried over magnesium sulfate and the solvent was removed in vacuo to give 0.6 grams of the desired product.

Preparation of 27a

To a mixture of 100.0 g (561.3 mmol 1 eq) of ninhydrin in 500 mL of chloroform was added 92.2 g (93.3 mL, 561 mmol; 1 eq) of N,N-diethylphenylene diamine in a dropwise fashion. The temperature was maintained below 25° C. The reaction mixture turned blue and was stirred at room temperature overnight. The reaction mixture was washed with water and concentrated to give crude yield of 170.7 grams. This material was recrystallized from approximately 1400 mL of ethanol with hot filtration to give 138.8 grams (78% yield) of the desired product, mp 138°–140° C.

Preparation of 27e. 28, 29 and 30.

These compounds were all prepared by a method similar to that described above.

Preparation of 27b 27c and 27d.

These compounds were all prepared by a method similar to that described for 27a except that the acid salts of the corresponding phenylene diamines were used and an equivalent amount of sodium bicarbonate was added to the reaction mixtures for each equivalent of ammonium salt present. The reaction mixtures were washed with water and the organic phase concentrated in vacuo to give the desired products.

Preparation of 27g

A mixture of 1.7 grams (9.5 mmol; 1 eq.) of ninhydrin and 2.0 grams (9.5 mmol; 1 eq.) of N-(4-amino-2-chlorophenyl) morpholine was added 17 mL of methylene chloride was heated to reflux with 1.5 mL of acetic acid and heated for 14 hours. The reaction mixture was cooled and filtered. The residue was washed with methylene chloride. The filtrate was washed with saturated aqueous sodium bicarbonate until the aqueous layer was basic. The organic layer was washed with water and concentrated in vacuo to give 2.3 grams of the desired product.

Preparation of 27f

This material was prepared in a manner similar to 27g.

Preparation of 1-butyl-3-cyano-4-methyl-6-hydroxy-2-pyridone.

This material was prepared by the procedure described in German Pat, No. 2,845,863.

Preparation of 39

To a mixture of 1.0 grams (4.85 mmol) of the pyridone and 6.6 grams (48.5 mmol, 10 eq) of sodium acetate in 50 mL of ethanol was added 1.27 grams (4.85 mmol, 1 eq) of 4-diazo-N,N'-diethylaniline tetrafluoroborate. The reaction mixture turned blue immediately upon addition of the diazo compound. The mixture was stirred at room temperature for two hours and 50 mL of water was added. The blue solid was collected and washed with water and dried. This material was recrystallized from approximately 200 mL of ethanol to give 1.2 grams (65% yield) of the desired product. This material decomposes at 180°–185° C. with effervescence.

Preparation of 40

Compound 40 was prepared in a manner similar to 39.

Preparation of 41

To a mixture of 90.0 grams (436 mmol, 1.0 eq) of 1-butyl-3-cyano-4-methyl-6-hydroxy-2-pyridone in 1080 mL of acetic acid was added 87.1 grams (489 mmol 1.12 eq) of N,N-diethyl-4-nitrosoaniline and the mixture was stirred and the reaction exothermed to 40° C. and cooling was applied. The mixture was stirred over night and the solid was collected by filtration, washed with approximately 200 mL of acetic acid and then twice with petroleum ether and air dried to give (120.8 grams, 76% yield) of the corresponding imino dye, mp 185°–186° C. (dec).

Preparation 1,1-Bis(4-dimethylaminophenol)ethylene.

To a mixture of 40.0 grams (149 mmol, 1 eq) of 4,4'-bis (dimethylamino)benzophenone in 100 mL of THF was added 138 mL of 1.4M methylmagnesium bromide. The mixture was cooled to keep the temperature below 20° C. during the addition. The mixture was warmed to room temperature and stirred overnight. The reaction mixture was cooled and quenched with approximately 50 mL of water and extracted with ethyl acetate. During this procedure, gel-like solids precipitated. These solids were filtered and washed with ethyl acetate. The organic layer was dried with magnesium sulfate and concentrated in vacuo to give 26.5 grams of crude product (approximately 63% yield). The crude product (26.5 grams, 93.2 mmol) was stirred with 265 mL of toluene and 132 mL of acetic acid. The mixture turned dark blue upon addition of the acetic acid. The mixture was stirred at room temperature overnight, then washed with water, saturated aqueous sodium bicarbonate, and water. The organic layer was concentrated in vacuo to give 20.2 grams (81% yield) of the desired product, mp 126°–127° C. (Lit. 126° C.).

Preparation of 45

Compound 45 was prepared in a manner similar to that described for Example 13 in U.S. Pat. No. 5,360,582. A mixture of 6.16 grams (37.5 mmol, 1 eq) of malonaldehyde tetramethylacetal (MTA) and 10.5 grams (37.5 mmol, 1 eq) of methylene bis(trifluoromethylsulfone) was stirred with 15.3 grams (150 mmol, 4 eq) of acetic anhydride at 70° C. for 2 hours. The mixture turned deep red. The mixture was cooled and 10.0 grams (37.5 mmol, 1 eq) of 1,1-bis(4-dimethylaminophenyl)ethylene was added. The mixture was stirred overnight at room temperature and approximately 28 mL of methanol was added. The blue solid was collected and an additional 14 mL of methanol was used to collect the solid and wash the product. The solid was air dried to give 17.2 grams (79% yield) of the desired product.

Evaluation of Dyes

Dyes were evaluated for utility in providing a visible image in positive-acting printing plate applications in the following manner. A solution was prepared with each dye of the general formulation:

| | |
|---|---|
| Tetrahydropyran ester of poly (methyl methacrylate) | 0.355 g |
| Ditolyliodonium hexafluorophosphate | 0.09 g |
| 2-Ethyl-9,10-dimethoxyanthracene | 0.045 g |
| 1-Methoxy-2-propanol | 4.50 g |
| Dye | 0.01 g |

The solutions were coated on an electrochemically grained and anodized aluminum substrate using a #5 wire wrapped rod (R&D Specialties, Webster, N.Y.). After coating, the samples were dried in an oven at a temperature between 65° and 107° C. In some instances a top coat layer was applied on top of the first layer. The formulation of the top coat solution used was the following:

| | |
|---|---|
| Rohm & Haas Acusol ™ 445 (purchased as 48% solids) | 340 g |
| Gum arabic | 85.0 g |
| Union Carbide Triton ™ X-100 | 4.4 g |
| Kathon CG/ICP | 3.4 g |
| 25% Sodium Hydroxide | 160 g |
| De-ionized Water | 2,968 g |

The top coat solution was applied using a #5 wire wrapped rod (R&D Specialties, Webster, N.Y.). After coating the samples were dried in an oven at a temperature between 65° and 107° C. Constructions were evaluated by exposure to actinic radiation in a vacuum frame. After exposure, the susceptibility of the bleached dye to revert to its colored form was determined by at least one of the following test methods A–C: A) Storage for 3 days at ambient and 60° C. conditions, B) Contact with fingers and expelled breath, and C) contact with a pH 7.5 solution. The results of the above tests for utility are listed in Tables 1–6. Test method D involves dissolving a sample of the dye in methanol, ethanol or 1-methoxy-2-propanol and observing the color of the solution. A drop of 12M hydrochloric acid was added and the behavior of the dye was observed. In some cases, sufficient aqueous sodium hydroxide was added to neutralize the acid and the ability of the dye to recolor was observed.

TABLE 1

Structure I

| Example | Coated Color | Exposed Color | Top Coat | Test method | Recolor |
|---|---|---|---|---|---|
| 5a | blue | colorless | no | A | no |
| 5b | blue | colorless | yes | A, B, C | no |
| 5c | blue | colorless | yes | A, B, C | no |

TABLE 2

Structure II

| Example | Coated Color | Exposed Color | Top Coat | Test method | Recolor |
|---|---|---|---|---|---|
| 10 | magenta | largely colorless | — | D | no |
| 11 | magenta | colorless | no | A, B | slight |
| 12 | magenta | colorless | no | A | no |
| 13a | orange | colorless | — | D | no |
| 13b | magenta | colorless | yes | A, B, C | very slight |
| 14a | magenta | colorless | yes | A, B, C | very slight |
| 14b | magenta | colorless | yes | A, B, C | very slight |

TABLE 3

Structures III

| Example | Coated Color | Exposed Color | Top Coat | Test method | Recolor |
|---|---|---|---|---|---|
| 20 | very lt. purple | colorless | no | B, C | no |
| 21 | very lt. purple | colorless | no | B, C | no |
| 23 | red | colorless | no | A, B | slight |

TABLE 4

Structure IV

| Example | Coated Color | Exposed Color | Top Coat | Test method | Recolor |
|---|---|---|---|---|---|
| 27a | purple | colorless | no | A, B, C | no |
| 27b | blue | colorless | no | A, B, C | no |
| 27c | purple | colorless | no | A, B, C | no |
| 27f | light purple | colorless |  | A |  no |
| 28 | light purple | colorless | no | A, B, C | no |
| 29 | purple | colorless | no | A, B | no |
| 30 | cyan | colorless | no | A, B | no |

TABLE 5

Structure V and VI

| Example | Coated Color | Exposed Color | Top Coat | Test method | Recolor |
|---|---|---|---|---|---|
| 41 | blue | colorless | no | C | slight |
| 45 | blue green | colorless | no | A, B | slight |

TABLE 6

Comparative Examples

| Example | Coated Color | exposed color | Top Coat | Test method | Recolor |
|---|---|---|---|---|---|
| 1a | light red | colorless | no | A | yes |
| 1b | magenta | colorless | no | B, C | yes |
| 1c | orange | colorless | no | B, C | yes |
| 2 | red | colorless | no | B, C | yes |
| 6 | blue | yellow | no | A, B | yes |
| 13c | magenta | colorless | yes | A | yes |
| 13d | magenta | colorless | yes | A | yes |
| 13e | magenta | colorless | yes | A | yes |
| 13f | magenta | colorless | yes | A | yes |
| 13g | magenta | colorless | yes | A | yes |
| 16a | magenta | colorless | yes | A, B | yes |
| 16b | magenta | colorless | yes | A, B | yes |
| 19a | magenta | colorless | yes | A, B | yes |
| 19b | magenta | colorless | yes | A | yes |
| 19d | magenta | colorless | yes | A | yes |
| 19e | magenta | colorless | yes | A | yes |
| 22 | purple | yellow | no | A, B | yes |
| 24 | magenta | colorless | — | D | yes |
| 25 | magenta | largely colorless | — | D | yes |
| 26 | purple | largely colorless | — | D | yes |
| 31 | red | colorless | — | D |  |
| 32 | red-orange | colorless | — | D |  |
| 33 | red | colorless | — | D | yes |
| 34 | blue | colorless | — | D |  |
| 35 | blue | partial decolor | — | D |  |
| 36 | orange | largely colorless | — | D |  |
| 37 | yellow | partial decolor | — | D |  |
| 38 | orange | light yellow | — | D |  |
| 39 | purple | yellow | no | A, | yes |
| 40 | purple | yellow | no | A, | yes |
| 42b | magenta | colorless | — | D |  |
| 42c | magenta | colorless | — | D |  |
| 42d | purple-blue | light yellow | — | D |  |
| 43a | blue | partial decolor | — | D | yes |
| 43b | blue | yellow | no | A, B | yes |
| 44 | blue | light yellow | — | D |  |
| 46a | magenta | lt. pink | no | A, B | yes |
| 46b | magenta | lt. pink | no | A, B | yes |
| 46c | magenta | magenta | no | — | — |

Reasonable variations and modifications are possible from the foregoing disclosure without departing from either the spirit or scope of the present invention.

We claim:

1. An article comprising a substrate coated with a photosensitive composition comprising: (a) a photoinitiator which generates a strong acid upon exposure to radiation; (b) a polymer having acid-labile groups pendant from the polymer backbone; and (c) a dye capable of being irreversibly bleached by said acid, providing a visible image upon exposure to radiation.

2. The article of claim 1 wherein said dye has a central nucleus selected from the group of formulas consisting of:

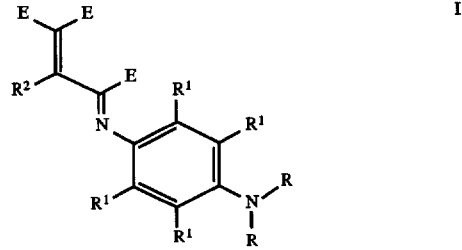

I wherein R is independently an alkyl, cycloalkyl, alkaryl, or alkanoyl group having from 1 to 16 carbon atoms, or each R together with the nitrogen atom to which they are attached represents the necessary atoms to form a five- or six-membered ring; $R^1$ is independently hydrogen, halogen, cyano, or an alkyl, cycloalkyl, or alkoxy group having from 1 to 8 carbon atoms; or R and $R^1$ together with the nitrogen and two carbon atoms by which they are connected represent the necessary atoms to form a five- or six-membered ring; $R^2$ is Ar or an alkyl, cycloalkyl, or alkaryl group having from 1 to 16 carbon atoms; Ar is a substituted or unsubstituted aryl group; E is independently an electron withdrawing group selected from the group consisting of CN, $SO_2R^3$, $C(O)R^3$, and $NO_2$; and $R^3$ is independently an alkyl, cycloalkyl, or alkaryl group having from 1 to 16 carbon atoms, or each $R^3$ taken together with the atoms to which they are attached represent the necessary atoms to form a five- or six-membered ring;

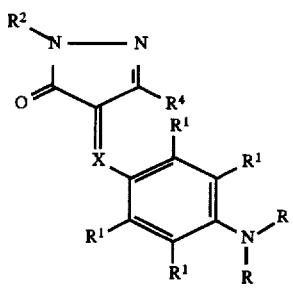

wherein X is N or $CR^1$; $R^4$ is H, $CH_3$, $NHR^2$, $NHC(O)R^2$, or $NR_2$; and R, $R^1$ and $R^2$ are as previously defined;

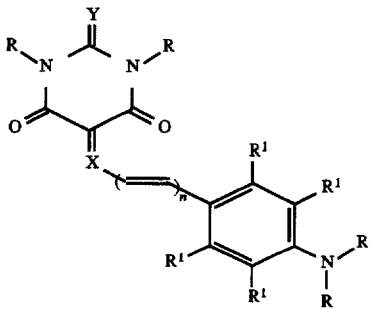

wherein Y is O or S; n is 0 or 1; and R, $R^1$, and X are as previously defined with the proviso that when Y is S, then X is N;

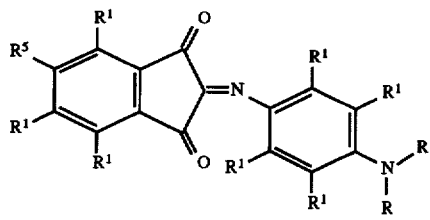

wherein R and $R^1$ are as previously defined; $R^5$ is $R^1$, or $R^5$ and $R^1$ taken together with the two carbon atoms by which they are connected represent the necessary atoms to form a five- or six-membered carbocyclic or heterocyclic, non-aromatic or aromatic ring;

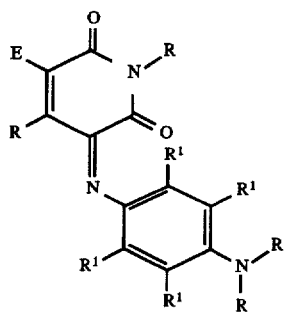

wherein R, $R^1$, and E are as previously defined; and

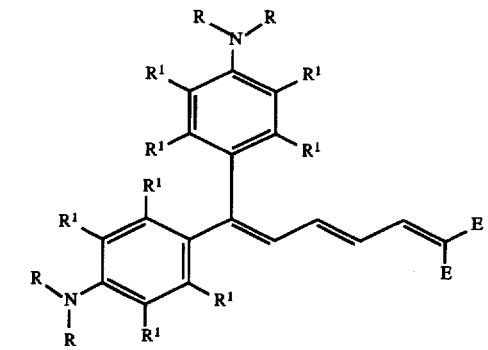

wherein R, $R^1$, and E are as previously defined.

3. The article of claim 2 wherein said polymer is of the formula:

$$-T-\overset{O}{\underset{\|}{C}}-O-\underset{\underset{R^7}{|}}{\overset{\overset{R^6}{|}}{C}}-O-R^8$$

wherein $R^6$ and $R^7$ each represent H or an alkyl group with 1 to 18 carbon atoms with the proviso that at least one of $R^6$ and $R^7$ must be hydrogen; $R^8$ represents an alkyl group with 1 to 18 carbon atoms; or any two of $R^6$, $R^7$, and $R^8$ may together form a substituted or unsubstituted ring having from 3 to 36 carbon atoms; and T represents an optional divalent linking group bonded to the polymer backbone selected from the group consisting of O, NH, S, and an alkylene group containing from 1 to about 18 carbon atoms.

4. The article of claim 3 wherein the article is a positive-acting no-process printing plate.

5. The article of claim 3 wherein said dye is of the formula:

(structure II repeated)

wherein R is independently an alkyl, cycloalkyl, alkaryl, or alkanoyl group having from 1 to 16 carbon atoms, or each R together with the nitrogen atom to which they are attached represents the necessary atoms to form a five- or six-membered ring; $R^1$ is independently hydrogen, halogen, cyano, or an alkyl, cycloalkyl, or alkoxy group having from 1 to 8 carbon atoms; or R and $R^1$ together with the nitrogen and two carbon atoms by which they are connected represent the necessary atoms to form a five- or six-membered ring; $R^2$ is Ar or an alkyl, cycloalkyl, or alkaryl group having from 1 to 16 carbon atoms; Ar is a substituted or unsubstituted aryl group; X is N or $CR^1$; and $R^4$ is H, $CH_3$, $NHR^2$, $NHC(O)R^2$, or $NR_2$.

6. The article of claim 5 wherein R is ethyl, $R^1$ is hydrogen, $R^2$ is phenyl, X is nitrogen, and $R^4$ is methyl.

7. The article of claim 3 wherein said photoinitiator is a diaryliodonium salt.

8. The article of claim 7 wherein said photoinitiator is diphenyl or ditolyliodonium hexafluorophosphate.

9. The article of claim 7 wherein said photosensitive composition further comprises a sensitizer.

10. The article of claim 9 wherein said sensitizer comprises a substituted or unsubstituted anthracene.

11. The article of claim 10 wherein said sensitizer is 2-ethyl-9,10-dimethoxyanthracene or 9,10-diethoxyanthracene.

12. The article of claim 3 wherein said substrate is an aluminum sheet.

13. The article of claim 12 wherein said substrate is an electrochemically grained and anodized aluminum sheet.

14. A process for forming a visible image on an article comprising the steps of (a) providing a substrate coated with a photosensitive composition comprising: (1) a photoinitiator which generates a strong acid upon exposure to radiation; (2) a polymer having acid-labile groups pendant from the polymer backbone; and (3) a dye capable of being irreversibly bleached by said acid; and (b) irradiating said article, thereby providing a visible image.

15. The process of claim 14 wherein said dye has a central nucleus selected from the group of formulas consisting of:

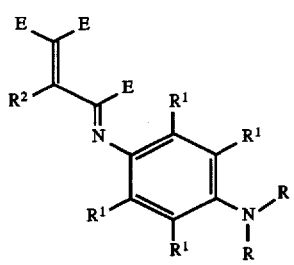

wherein R is independently an alkyl, cycloalkyl, alkaryl, or alkanoyl group having from 1 to 16 carbon atoms, or each R together with the nitrogen atom to which they are attached represents the necessary atoms to form a five- or six-membered ring; $R^1$ is independently hydrogen, halogen, cyano, or an alkyl, cycloalkyl, or alkoxy group having from 1 to 8 carbon atoms; or R and $R^1$ together with the nitrogen and two carbon atoms by which they are connected represent the necessary atoms to form a five- or six-membered ring; $R^2$ is Ar or an alkyl, cycloalkyl, or alkaryl group having from 1 to 16 carbon atoms; Ar is a substituted or unsubstituted aryl group; E is independently an electron withdrawing group selected from the group consisting of CN, $SO_2R^3$, $C(O)R^3$, and $NO_2$; and $R^3$ is independently an alkyl, cycloalkyl, or alkaryl group having from 1 to 16 carbon atoms, or each $R^3$ taken together with the atoms to which they are attached represent the necessary atoms to form a five- or six-membered ring;

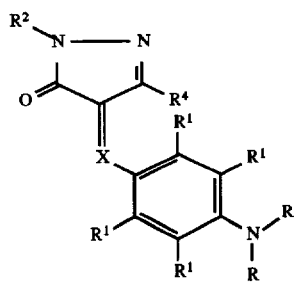

wherein X is N or $CR^1$; $R^4$ is H, $CH_3$, $NHR^2$, $NHC(O)R^2$, or $NR_2$; and R, $R^1$ and $R^2$ are as previously defined;

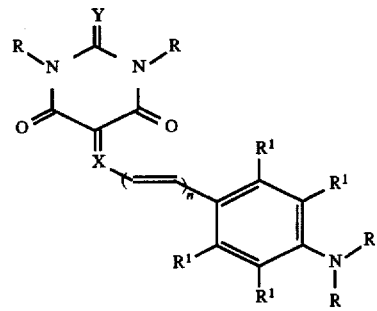

wherein Y is O or S; n is 0 or 1; and R, $R^1$, and X are as previously defined with the proviso that when Y is S, then X is N;

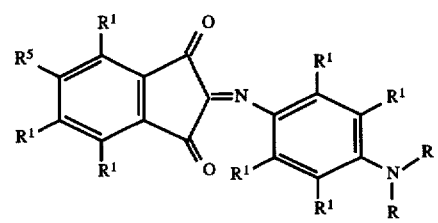

wherein R and $R^1$ are as previously defined; $R^5$ is $R^1$, or $R^5$ and $R^1$ taken together with the two carbon atoms by which they are connected represent the necessary atoms to form a five- or six-membered carbocyclic or heterocyclic, non-aromatic or aromatic ring;

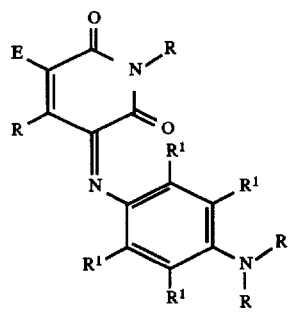

wherein R, $R^1$, and E are as previously defined; and

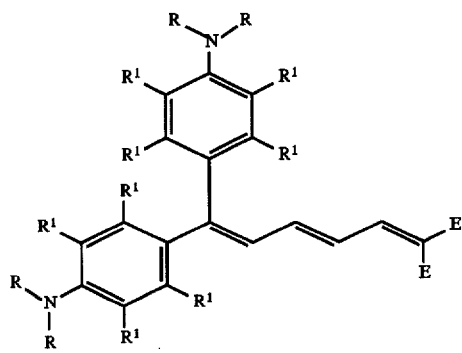

wherein R, $R^1$, and E are as previously defined.

16. The process of claim 15 wherein said polymer is of the formula:

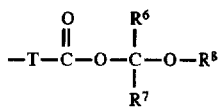

wherein $R^6$ and $R^7$ each represent H or an alkyl group with 1 to 18 carbon atoms with the proviso that at least one of $R^6$ and $R^7$ must be hydrogen; $R^8$ represents an alkyl group with 1 to 18 carbon atoms; or any two of $R^6$, $R^7$, and $R^8$ may together form a substituted or unsubstituted ring having from 3 to 36 carbon atoms; and T represents an optional divalent linking group bonded to the polymer backbone selected from the group consisting of O, NH, S, and an alkylene group containing from 1 to about 18 carbon atoms.

17. The process of claim 16 wherein the article is a positive-acting no-process printing plate.

18. The process of claim 16 wherein said dye is of the formula:

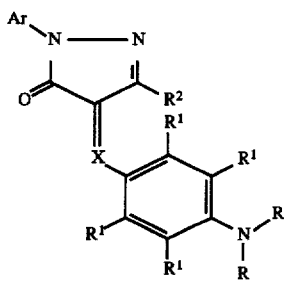

II wherein R is independently an alkyl, cycloalkyl, alkaryl, or alkanoyl group having from 1 to 16 carbon atoms, or each R together with the nitrogen atom to which they are attached represents the necessary atoms to form a five- or six-membered ring; $R^1$ is independently hydrogen, halogen, cyano, or an alkyl, cycloalkyl, or alkoxy group having from 1 to 8 carbon atoms; or R and $R^1$ together with the nitrogen and two carbon atoms by which they are connected represent the necessary atoms to form a five- or six-membered ring; $R^2$ is Ar or an alkyl, cycloalkyl, or alkaryl group having from 1 to 16 carbon atoms; Ar is a substituted or unsubstituted aryl group; X is N or $CR^1$; and $R^4$ is H, $CH_3$, $NHR^2$, $NHC(O)R^2$, or $NR_2$.

19. The process of claim 18 wherein R is ethyl, $R^1$ is hydrogen, $R^2$ is phenyl, X is nitrogen, and $R^4$ is methyl.

20. The process of claim 16 wherein said photoinitiator is a diaryliodonium salt.

21. The process of claim 20 wherein said photoinitiator is diphenyl or ditolyliodonium hexafluorophosphate.

22. The process of claim 20 wherein said photosensitive composition further comprises a sensitizer.

23. The process of claim 22 wherein said sensitizer comprises a substituted or unsubstituted anthracene.

24. The process of claim 23 wherein said sensitizer is 2-ethyl-9,10-dimethoxyanthracene or 9,10-diethoxyanthracene.

25. The process of claim 16 wherein said article is exposed through a mask.

26. The process of claim 16 wherein said article is a positive-acting no-process printing plate.

27. The process of claim 16 wherein said article is exposed to actinic radiation of wavelength between 250 nm and 1200 nm.

28. The process of claim 16 wherein said substrate is an aluminum sheet.

29. The process of claim 28 wherein said substrate is an electrochemically grained and anodized aluminum sheet.

* * * * *